(12) United States Patent
Shao et al.

(10) Patent No.: US 11,330,741 B2
(45) Date of Patent: May 10, 2022

(54) MODULAR DESIGN OF BLIND MATE INTERFACE FOR LIQUID COOLING

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/830,533

(22) Filed: Mar. 26, 2020

(65) Prior Publication Data
US 2021/0307208 A1    Sep. 30, 2021

(51) Int. Cl.
*H05K 7/20* (2006.01)
*H05K 7/14* (2006.01)

(52) U.S. Cl.
CPC ....... *H05K 7/20781* (2013.01); *H05K 7/1489* (2013.01); *H05K 7/20272* (2013.01)

(58) Field of Classification Search
CPC ............. H05K 7/20272; H05K 7/1489; H05K 7/20263; H05K 7/20327; H05K 7/20572; H05K 7/20636; H05K 7/20645; H05K 7/20727; H05K 7/20809; H05K 7/20781; G06F 2200/201; H01R 3/08; H01R 13/5219; H01R 13/6205; F16L 17/025; F16L 33/16; F16L 37/12; F16L 37/35; Y10T 137/87957
See application file for complete search history.

(56) References Cited

U.S. PATENT DOCUMENTS

| | | | | |
|---|---|---|---|---|
| 5,348,482 A * | 9/1994 | Rudy, Jr. | ........ | H05K 7/1412 |
| | | | | 361/725 |
| 6,657,121 B2 * | 12/2003 | Garner | ........ | H05K 7/20681 |
| | | | | 174/16.3 |
| 7,097,047 B2 * | 8/2006 | Lee | ........ | H05K 7/1449 |
| | | | | 211/26.2 |
| 8,047,383 B2 * | 11/2011 | Hendrix | ........ | H05K 7/1418 |
| | | | | 211/26 |
| 8,173,904 B1 * | 5/2012 | Parduhn | ........ | H01B 17/06 |
| | | | | 174/137 R |
| 8,654,532 B2 * | 2/2014 | Chen | ........ | H05K 7/20781 |
| | | | | 361/701 |
| 8,801,122 B2 * | 8/2014 | Chapel | ........ | H05K 7/1489 |
| | | | | 312/334.4 |
| 8,824,147 B2 * | 9/2014 | Caron | ........ | H05K 7/20636 |
| | | | | 361/702 |
| 8,964,396 B1 * | 2/2015 | Dailey | ........ | H05K 7/1454 |
| | | | | 361/727 |
| 9,161,477 B2 * | 10/2015 | Demange | ........ | H05K 7/20218 |
| 9,261,310 B2 * | 2/2016 | Fried | ........ | H05K 7/20809 |
| 9,379,614 B2 * | 6/2016 | Meinecke | ........ | H02M 3/158 |
| 9,655,281 B2 * | 5/2017 | Harvilchuck | ........ | F28F 9/0075 |
| 10,431,926 B2 * | 10/2019 | Franz | ........ | H01R 13/6205 |
| 10,582,639 B1 * | 3/2020 | Chopra | ........ | H05K 7/20636 |

(Continued)

*Primary Examiner* — Michael A Matey
(74) *Attorney, Agent, or Firm* — Womble Bond Dickinson (US) LLP

(57) ABSTRACT

A fluid connector includes an adapter panel defining at least two mounting holes configured to be secured to a mounting rail of a server chassis. The fluid connector also includes an interior connector configured to fluidly communicate with a cooling module of a server, and a blind mate connector extending from the adapter panel and configured to fluidly connect with a port of a rack manifold.

18 Claims, 6 Drawing Sheets

(56) References Cited

U.S. PATENT DOCUMENTS

| | | | |
|---|---|---|---|
| 10,881,030 B1* | 12/2020 | Lunsman | H05K 7/20336 |
| 2002/0179875 A1* | 12/2002 | Davis | F16L 37/32 |
| | | | 251/149.6 |
| 2003/0112593 A1* | 6/2003 | Smith | G06F 1/181 |
| | | | 361/679.32 |
| 2003/0128515 A1* | 7/2003 | Faneuf | H05K 7/20809 |
| | | | 361/700 |
| 2003/0136749 A1* | 7/2003 | Williams | A47B 88/43 |
| | | | 211/26 |
| 2006/0274508 A1* | 12/2006 | LaRiviere | H05K 7/1488 |
| | | | 361/727 |
| 2007/0115627 A1* | 5/2007 | Carlisi | H05K 7/1489 |
| | | | 361/679.01 |
| 2007/0119792 A1* | 5/2007 | Hendrix | H05K 7/1425 |
| | | | 211/26 |
| 2008/0259566 A1* | 10/2008 | Fried | H05K 7/20809 |
| | | | 361/699 |
| 2009/0159241 A1* | 6/2009 | Lipp | F28F 9/002 |
| | | | 165/80.2 |
| 2009/0161312 A1* | 6/2009 | Spearing | H05K 7/20772 |
| | | | 361/679.47 |
| 2009/0260777 A1* | 10/2009 | Attlesey | H05K 7/20772 |
| | | | 165/67 |
| 2010/0002393 A1* | 1/2010 | Campbell | H05K 7/20772 |
| | | | 361/699 |
| 2011/0240281 A1* | 10/2011 | Avery | H05K 7/20836 |
| | | | 165/287 |
| 2011/0313576 A1* | 12/2011 | Nicewonger | F28D 15/00 |
| | | | 700/282 |
| 2012/0091075 A1* | 4/2012 | Chapel | H05K 7/1489 |
| | | | 211/26 |
| 2013/0312854 A1* | 11/2013 | Eriksen | H05K 7/20327 |
| | | | 137/544 |
| 2014/0020869 A1* | 1/2014 | Davidson | G06F 1/20 |
| | | | 165/104.21 |
| 2014/0111930 A1* | 4/2014 | Henderson | H05K 13/04 |
| | | | 361/679.31 |
| 2014/0233175 A1* | 8/2014 | Demange | H05K 7/20254 |
| | | | 361/679.47 |
| 2015/0245531 A1* | 8/2015 | Meinecke | H05K 7/1492 |
| | | | 361/679.02 |
| 2017/0127575 A1* | 5/2017 | Lunsman | H05K 7/20772 |
| 2018/0067012 A1* | 3/2018 | Franz | G01M 3/16 |
| 2018/0242478 A1* | 8/2018 | Cui | H05K 7/20772 |
| 2018/0270984 A1* | 9/2018 | Christenson | F16B 2/18 |
| 2018/0279510 A1* | 9/2018 | Johnson | H05K 7/20772 |
| 2018/0303007 A1* | 10/2018 | Gao | H05K 7/20272 |
| 2019/0050030 A1* | 2/2019 | Baum | G06F 1/189 |
| 2019/0053397 A1* | 2/2019 | Larson | H05K 7/1498 |
| 2020/0099163 A1* | 3/2020 | Tziviskos | H01R 13/17 |
| 2020/0149667 A1* | 5/2020 | Collins | F16L 21/03 |
| 2020/0260608 A1* | 8/2020 | Thibaut | G06F 1/28 |
| 2020/0304889 A1* | 9/2020 | Weltsch | H04Q 1/035 |
| 2021/0195804 A1* | 6/2021 | Gao | H05K 7/20872 |

* cited by examiner

MODULAR DESIGN OF BLIND MATE INTERFACE FOR LIQUID COOLING

FIELD OF THE DISCLOSURE

Embodiments of the present invention relate generally to electronics and server thermal management. More particularly, embodiments of the invention relate to a blind mate interface for liquid cooling of electronics and servers.

BACKGROUND

Reliability is one of the challenges for deploying liquid cooling solutions in electronics and server cooling systems. Connectors are one of the key components in a liquid cooling system, and they are the parts which often have high failure rates. Properly designing and implementing fluid connectors in liquid cooling systems is important. Various types of quick disconnects are gradually being adopted by the server and data center thermal system designers, since they bring several benefits to the system. Examples of the benefits provided by quick disconnects include: ease of server installation, and no requirement of manual operation for fluid connectors.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
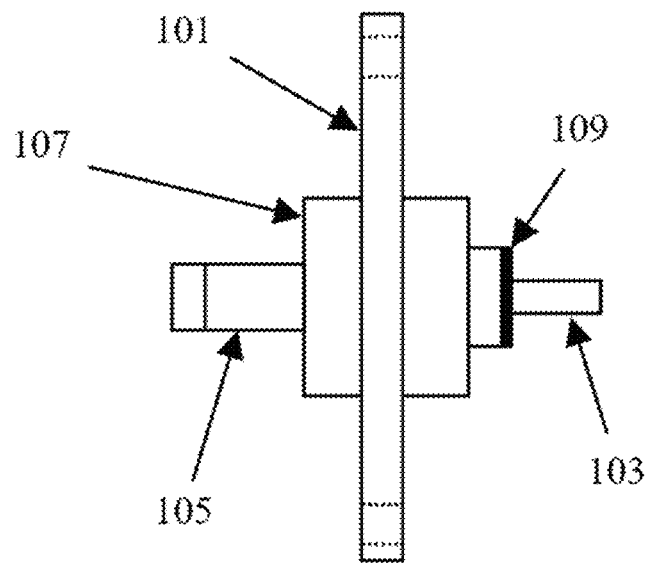
FIG. 1 shows a side view of a blind mate adapter, according to embodiments of the present disclosure.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," and "device" are intended to refer generally to data processing systems rather than specifically to a particular form factor for the server, and/or device.

As used herein, blind mate connectors describe a type of connector with self-aligning features, such that the connectors can be secured together without the use of manual tools. The blind mate connectors include male and/or female parts that can be connected by simply pushing the server into the rack. In contrast, in a non-blind mate design, the operator needs to manually finish the connection after the server is mounted in the rack. One key feature of the blind mate connectors is that they allow a certain level of tolerance in axial alignment for male and female parts.

Embodiments described herein provide for a solution for developing and deploying cooling solutions for servers or IT hardware equipment. In some embodiments, the present disclosure provides for the compatibility of different servers and IT equipment with facility infrastructures (such as data centers, racks, and other deployment environments). For example, a data center and a server are often not designed at the same time or by the same group of people. Furthermore, the lifetime of a data center and a server are different. Therefore, a data center may not be able to support operating multiple types of servers even though there are multiple design standards to follow. The variations and generational renewal in servers and IT equipment are much faster than the generational renewal of data center facility infrastructure. For example, the data center cooling design may not able to support certain types of servers. Embodiments of the present disclosure provide for an adapting module which may be used to solve these compatibility issues.

In liquid cooling infrastructure, the cooling liquid may be supplied to a rack manifold and then to a cooling module of a server. However, in modular server designs, it can be difficult to ensure that the liquid ports of the rack manifold and the liquid ports of the server are compatible and easily connected. Blind mate connectors may solve many of the failures caused by human error in connecting the fluid ports of the server cooling modules with the rack manifold. However, there exists a need for a full system design of the connectors along with the server chassis, and including a full consideration of both the rack manifold side and server cooling module/chassis side. Increased component reliability, along with a more mature design method is needed.

According to one embodiment, the present disclosure provides a design method for implementing blind mate connectors on a server chassis, as well as a structural design for enhancing reliability of using blind mate connectors in server liquid cooling. In one embodiment, a modular design of a blind mate interface for liquid cooling ports provides a method to connect a cooling module in a server to a rack manifold via blind mating.

In one embodiment, the blind mate interface is designed as a fluid adapter module, which can be compatible with the original design of any cooling module within a server chassis, and does not need to affect the design or installation of the cooling module.

System Overview

FIG. 1 shows a side view of a blind mate adapter, according to embodiments of the present disclosure. In this embodiment, the blind mate adapter includes an adapter panel 101, a blind mate connector 103 configured to connect with a port of a rack manifold, and an interior connector 105 configured to connect with a cooling module of a server. In some embodiments, the blind mate adapter also includes an adapter body 107, from which the blind mate connector 103 and the interior connector 105 extend. The blind mate adapter can also include a cushion ring 109 or a spring that can relieve stress when connecting the blind mate connector 103 to a port of a rack manifold. One skilled in the art will recognize that the blind mate connector 103 and the interior connector 105 can have different designs, and the blind mate adapter can be designed with any combination of male and/or female connectors.

Figure 2:
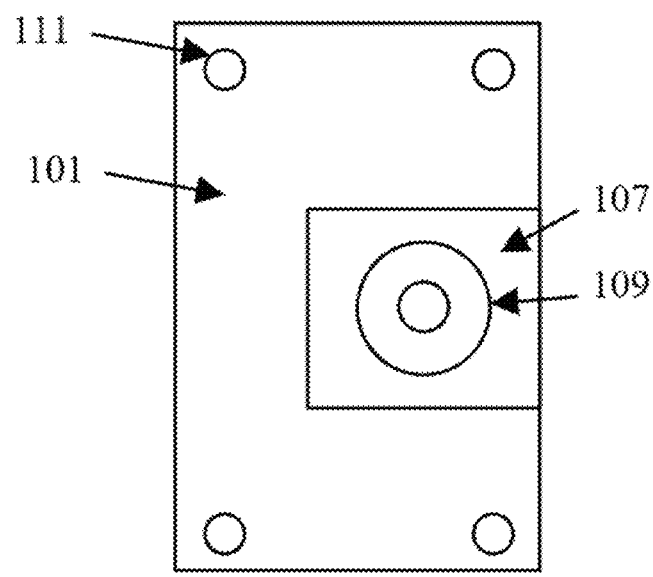
FIG. 2 shows a front view of the blind mate adapter of FIG. 1, according to embodiments of the present disclosure.

FIG. 2 shows a front view of the blind mate adapter of FIG. 1, according to embodiments of the present disclosure. In this embodiment, the adapter panel 101 defines a number of mounting holes 111, which can be used to secure the adapter panel 101 to the server chassis. Once secured to the server chassis, the blind mate adapter can facilitate the mating of a connector or port on the rack manifold to a fluid loop inside the server chassis.

In some embodiments, the blind mate connector 103 can be fastened to the adapter body 107 via a screw thread, for example. The interior connector 105 can also be secured to the adapter body in this way, and is configured to connect with the fluid loop inside the server. The specifications of the interior connector 105 should be designed to mate with the loop inside the server, such as the fluid loop of a cooling module. For example, the interior connector 105 can have a barb fitting to connect with tubes directly inside the server chassis.

In some embodiments, liquid should be able to flow from the interior connector 105 to the blind mate connector 103, or the other way around, depending on whether the adapter is working as an inlet or an outlet. In some embodiment, the adapter body 107 is attached to the adapter panel 101, while in other embodiments the adapter body 107 and adapter panel 101 are integral to one another. The function of the adapter panel 101 is to mount the adapter to a server chassis. In some embodiments, the adapter panel 101 can be secured to a cooling module within the server chassis, or to a mounting rail attached to the server chassis.

Figure 3:
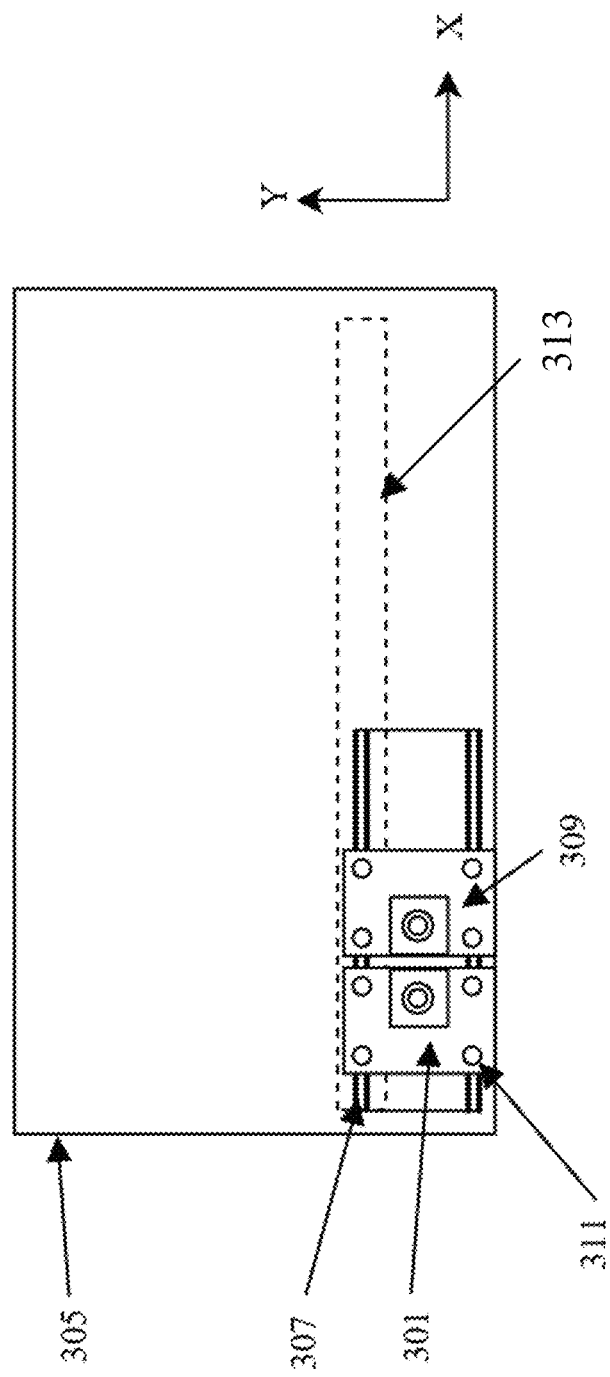
FIG. 3 shows two blind mate adapters secured to mounting rails of a server chassis, according to embodiments of the present disclosure.

FIG. 3 shows two blind mate adapters 301, 309 secured to mounting rails 307 of a server chassis 305, according to embodiments of the present disclosure. In this embodiment, an inlet adapter 301 and an outlet adapter 309 are secured to mounting rails 307 via mounting holes 311. The inlet adapter 301 and the outlet adapter 309 are configured to fluidly connect with a cooling module 313 within the server chassis. In some embodiments, the cooling module 313 can include all of the cold plates and related structures, such as frames, bars, etc. In this way, the cooling module 313 and the adapters can be fully assembled and tested outside of the serve chassis, such as on some specialized machinery or equipment. Once assembled and tested, the cooling module 313 can simply be mounted on the IT devices, such as AI acceleration cards, and the adapters allow for easy connection with the rack manifold, which functions as the cooling fluid source. There is no additional plumbing work or assembly operations needed inside the server chassis with the IT devices. Such a design can increase the reliability and quality of the liquid cooling loop, as well as reduce the amount of assembly operations inside the chassis and thus lower the risk of damaging IT devices.

Figure 4:
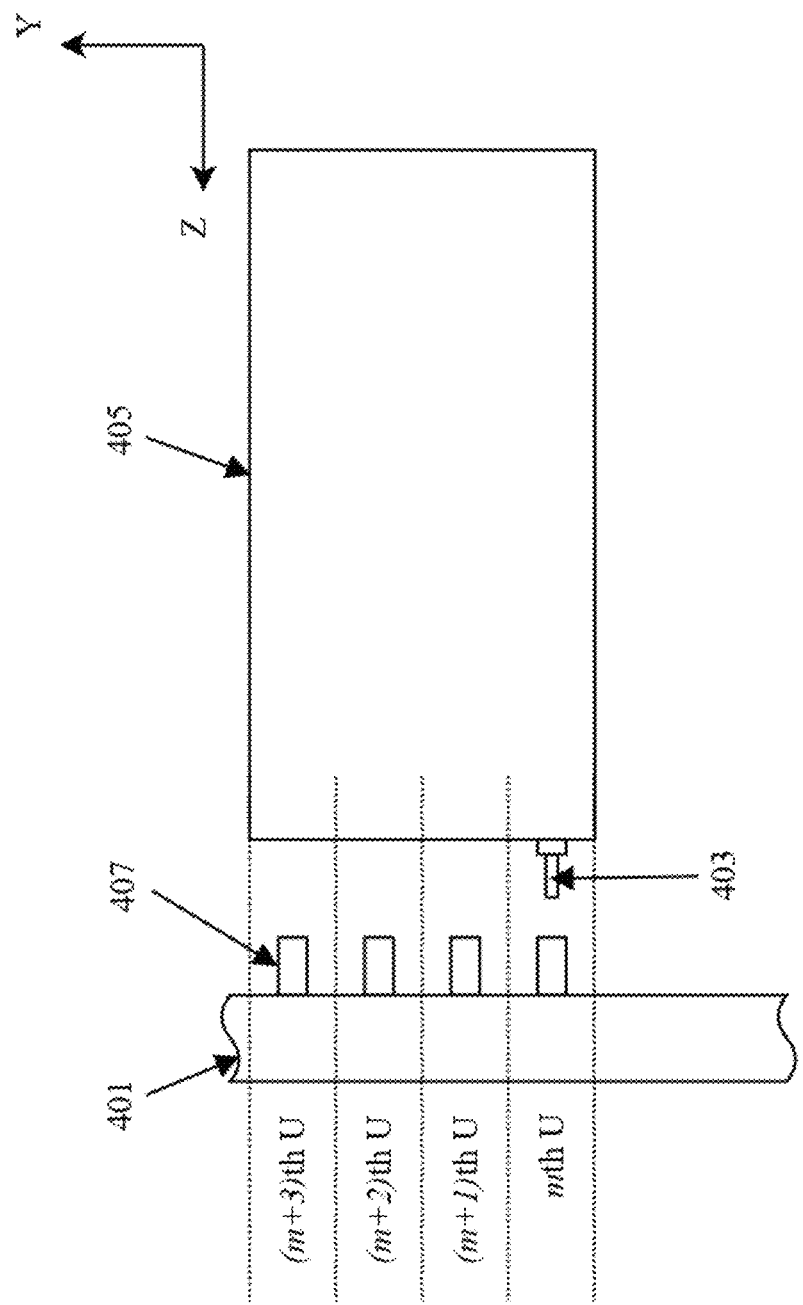
FIG. 4 shows a side view of a server chassis with a blind mate adapter and a rack manifold, according to embodiments of the present disclosure.

FIG. 4 shows a side view of a server chassis 405 with a blind mate adapter 403 and a rack manifold 401, according to embodiments of the present disclosure. In this embodiment, the blind mate adapter 403 is secured to the server chassis 405 and configured to connect with one of the ports 407 of the rack manifold 401. This modular design allows easy compatibility between the server chassis 405 and the rack manifold 401. In some embodiments, the blind mate interface is designed based on the specifications of the cooling module and the rack manifold 401. Thus, the spacing distance of the ports or blind mate connectors on the rack manifold should match and align with those of the blind mate adapters mounted on the cooling modules of the server chassis, with a certain level of tolerance in the X and Y directions.

In one embodiment, a standard server height "U" is defined as a unit of measurement. For example, 1U=46.5 mm. The specific height value of 1U can vary slightly depending on which industry standard is being used. The height information U is often labeled on the rack manifold, in some embodiments. The embodiment shown in FIG. 4 shows a 4U server populating the rack space from mth U to (m+3)th U. In this embodiment, the connector distribution on the rack manifold should comply with the aforementioned height standard. For example, there is on connector per U height, and it is located right in the middle line between mth U and (m+1)th U. Similarly, the adapter on the cooling module should comply with the same standard. After the adapter is mounted on the mounting rail, its blind mate connector is located right in the middle line between mth U and (m+1)th U.

In one embodiment, for a liquid-cooled server, first its cooling module and the adapter are assembled outside the chassis. In some embodiments, the cooling module and adapter are assembled by some specialized equipment. The mounting position of the adapter follow the compliance discussed in the previous paragraph. Then, the cooling module is mounted on the server board. Some fastening method may be used, in some embodiments, to secure the positions of the cooling module and the adapter. The blind mating of the server with the rack manifold can be done by pushing the server into the rack.

In one embodiment, latches can be located on the server chassis and/or the rack manifold in order to secure the mating depth of the connection. In some embodiments, a cushion ring, as shown in FIG. 1, can also be used to secure the mating depth (along the Z axis). Latches can be used on the front panel of the server and the rack frame to make sure that the mating pair is fully engaged along the Z axis when mounting the servers. A polymer ring can be placed at the bottom of the male connector, in some embodiments, to act as the cushion to relieve stress in the Z axis. In an alternative embodiment, a spring can be used instead of a cushion ring. In such embodiments, the spring can be wound around the male connector.

In this example embodiment, the connector 403 of the server chassis 405 is a male connector, while the connector ports 407 of the rack manifold 401 are female connectors. One skilled in the art will recognize that the connectors can have different designs, and the blind mate adapters can be designed with any combination of male and/or female connectors.

Figure 5:
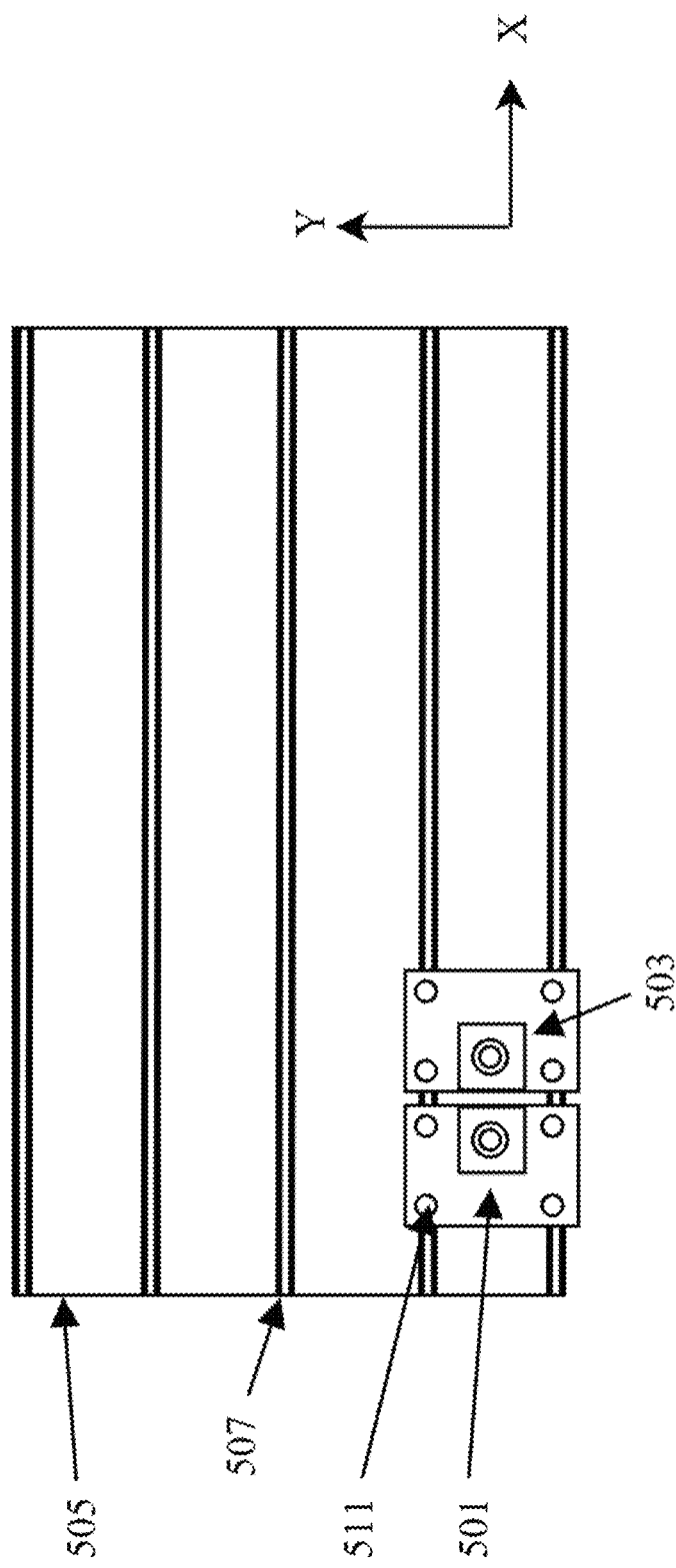
FIG. 5 shows two blind mate adapters secured to mounting rails of a server chassis, according to embodiments of the present disclosure.

FIG. 5 shows two blind mate adapters 501, 503 are secured to mounting rails 507 of a server chassis 505, according to embodiments of the present disclosure. In this embodiment, an inlet adapter 501 and an outlet adapter 503 are secured to mounting rails 507 via mounting holes 511. The inlet adapter 501 and the outlet adapter 503 are configured to fluidly connect with a cooling module within the server chassis. In some embodiments, rather than mounting to mounting rails of a cooling module, the adapters 501, 503 can be secured directly onto the server chassis 505 using mounting rails 507 as shown in FIG. 5. For example, the adapter can be mounted onto the back side of the server, assuming the rack manifold is installed on the back of the rack, as shown in FIG. 4. A 4U-height server chassis 505 is illustrated in this embodiment, with four mounting channels defined on the back side with the mounting rails 507, where each channel corresponds with each U position.

Figure 6:
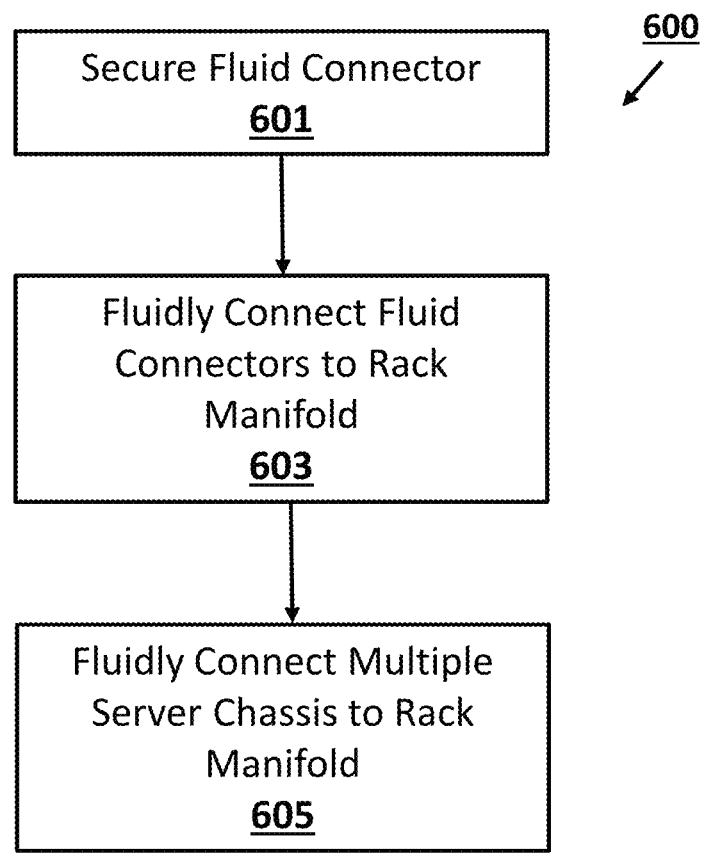
FIG. 6 illustrates a flow chart of an example method for assembling a modular liquid cooling system, according to embodiments of the present disclosure.

FIG. 6 illustrates a flow chart of an example method 600 for assembling a modular liquid cooling system, according to embodiments of the present disclosure. In this embodiment, method 600 begins with securing 601 at least one fluid connector to a server chassis. The fluid connector includes an interior connector that can fluidly communicate with a cooling module of a server or electronic component within the server chassis. The fluid connector also includes an adapter panel, and a blind mate connector extending from the adapter panel. In some embodiments, the adapter panel defines one or more mounting holes, and the adapter panel can be secured to the server chassis using mounting rails that are located on the server chassis.

At operation 603, the fluid connectors secured to the server chassis are fluidly connected to a port of the rack manifold using the blind mate connector extending from the adapter panel. In some embodiments, the server chassis includes a number of cooling modules, and multiple blind mate connectors are fluidly connected with ports of the rack manifold. In some embodiments, each cooling module requires two blind mate connectors to act as a fluid inlet and a fluid outlet.

At operation 605, multiple server chassis are fluidly connected to the rack manifold. In some embodiments, multiple server chassis can be installed within a server rack, and the server chassis may vary in height, as described above. In some embodiments, each server chassis includes one or more fluid connectors with adapter panels secured to mounting rails of the server chassis. In some embodiments, one or more of the server chassis can include latches that can engage with the rack manifold in order to secure the server chassis with respect to the rack manifold.

Figure 7:
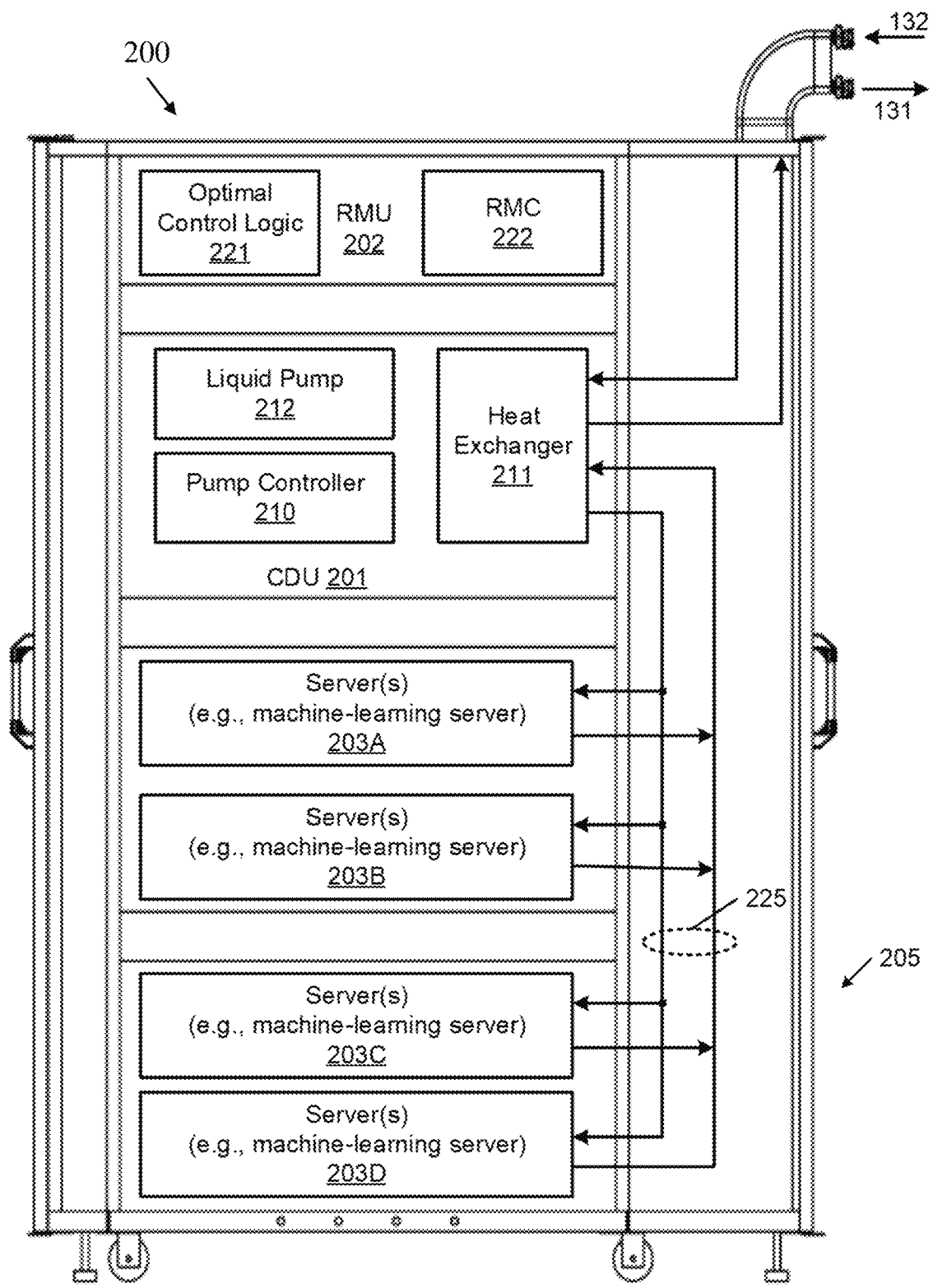
FIG. 7 illustrates an electronic rack according to embodiments of the present disclosure.

FIG. 7 is a block diagram illustrating a side view of an electronic rack according to one embodiment of the invention. Electronic rack 200 may represent any of the electronic racks described above. Referring to FIG. 7, in one embodiment, electronic rack 200 includes CDU 201, RMU 202, and one or more server blades 203A-203D, collectively referred to as server blades 203. Sever blades 203 can be inserted into an array of server slots or server chassis respectively from frontend 204 of electronic rack 200. Note that although there are only four server blades 203A-203D shown in FIG. 2, more or fewer server blades may be maintained within electronic rack 200. Also note that the particular positions of CDU 201, CMU 202, and server blades 203 are shown for the purpose of illustration only; other arrangements or configurations of CDU 201, CMU 202, and server blades 203 may also be implemented. Further, the front door disposed on frontend 204 and the back door disposed on backend 205 are optional. In some situations, there may no door on frontend 204 and/or backend 205.

In one embodiment, CDU 201 includes heat exchanger 211, liquid pump 212, and pump controller 210. Heat exchanger 211 may be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 may be disposed or mounted on backend 205 of electronic rack 200. In addition, heat exchanger 211 further includes a second tube having a second pair of liquid connectors coupled to liquid manifold 225, which may include a supply manifold to supply cooling liquid to server blades 203 and a return manifold to return warmer liquid back to CDU 201. The processors may be mounted on the cold plates, where the cold plates include a liquid distribution channel embedded therein to receive the cooling liquid from the liquid manifold 225 and to return the cooling liquid carrying the heat exchanged from the processors back to the liquid manifold 225. Each of server blades 203 may be coupled to the liquid manifold 225 via one or more liquid connectors as described above.

Each of server blades 203 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 200 further includes RMU 202 configured to provide and manage power supplied to server blades 203 and CDU 201. RMU 202 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimal control logic 221 and rack management controller (RMC) 222. The optimal control logic 221 is coupled to at least some of server blades 203 to receive operating status of each of the server blades 203, such as processor temperatures of the processors, the current pump speed of the liquid pump 212, and liquid temperature of the cooling liquid, etc. Based on this information, optimal control logic 221 determines an optimal pump speed of the liquid pump 212 by optimizing a predetermined objective function, such that the output of the objective function reaches the maximum while a set of predetermined constraints is satisfied. Based on the optimal pump speed, RMC 222 is configured to send a signal to pump controller 210 to control the pump speed of liquid pump 212 based on the optimal pump speed.

One skilled in the art would recognize that various adjustments can be made to the system within the scope of this disclosure. The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, or of an apparatus or system according to embodiments and examples described herein. Various components can be a means for performing the operations or functions described.

One embodiment provides for a fluid connector. The fluid connector includes an adapter panel defining at least two mounting holes configured to be secured to a mounting rail of a server chassis. The fluid connector also includes an interior connector configured to fluidly communicate with a cooling module of a server. The fluid connector also includes a blind mate connector extending from the adapter panel and configured to fluidly connect with a port of a rack manifold. In some embodiments, the adapter panel also includes an adapter body integrally formed with the adapter panel. In some embodiments, the fluid connector also includes a cushion ring positioned to engage with the adapter body and surround a portion of the blind mate connector. In some embodiments, the fluid connector also includes a spring positioned to engage with the adapter body and surround a portion of the blind mate connector. In some embodiments, the blind mate connector is a male fluid connector configured to engage with a female fluid port of the rack manifold. In some embodiments, the blind mate connector is positioned within the adapter panel at a predetermined height with respect to a frame of the server chassis, when secured to the mounting rail of the server chassis. In some embodiments, the adapter panel is secured to the mounting rail of the server chassis to align with the port of the rack manifold.

Another embodiment provides for a modular liquid cooling system with blind mate connectors. The system includes at least one server chassis configured to house a server with at least one cooling module. The system also includes at least one fluid connector secured to the server chassis, the fluid connector including an interior connector configured to fluidly communicate with the cooling module, and a blind mate connector extending from an adapter panel. The system also includes a rack manifold having at least one port configured to fluidly connect with the blind mate connector extending from the adapter panel. In some embodiments, the adapter panel is configured to secure to mounting rails of the server chassis. In some embodiments, the server chassis includes a number of server chassis, and each server chassis includes at least one fluid connector with an adapter panel secured to mounting rails. In some embodiments, a height of each of the server chassis is a multiple of a standard server height. In some embodiments, the rack manifold includes a number of ports positioned with respect to a multiple of the standard server height in order to align with blind mate connectors of the server chassis. In some embodiments, the server chassis is configured to house a number of cooling modules, and the server chassis includes a number of fluid connectors mounted thereon. In some embodiments, the cooling system also includes a latch mounted on the server chassis and configured to secure to a latch of the rack.

Another embodiment provides for a method of assembling a modular liquid cooling system with blind mate connectors. The method includes securing a fluid connector to a server chassis. The fluid connector includes an interior connector configured to fluidly communicate with the at least one cooling module, and a blind mate connector extending from an adapter panel. The method also includes fluidly connecting the fluid connector to a port of a rack manifold with the blind mate connector extending from the adapter panel. In some embodiments, securing the fluid connector to a server chassis includes securing the adapter panel to mounting rails of the server chassis. In some embodiments, the method also includes fluidly connecting a number of server chassis to ports of the rack manifold, wherein each server chassis includes at least one fluid connector and an adapter panel secured to mounting rails. In some embodiments, the method also includes engaging a latch mounted on the server chassis to a latch of the rack. In some embodiments, the server chassis is configured to house a number of cooling modules. In such an embodiment, a plurality of fluid connectors fluidly connects with a plurality of ports of the rack manifold.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A fluid connector system, comprising:
a server chassis that has a plurality of mounting rails mounted on the server chassis, wherein each mounting rail of the plurality of mounting rails are disposed at different heights on the server chassis;
an adapter panel defining at least two mounting holes configured to be secured to at least one of the plurality of mounting rails, wherein the server chassis is one of a plurality of server chassis mounted within an electronic rack of a data center;
an interior connector configured to fluidly communicate with a cooling module of a server of the server chassis; and
a blind mate connector extending from the adapter panel and configured to fluidly connect with a port of a rack manifold of the electronic rack, wherein the rack manifold is configured to provide coolant to the plurality of server chassis.

2. The system of claim 1, wherein the adapter panel also includes an adapter body integrally formed with the adapter panel.

3. The system of claim 2, further comprising a cushion ring positioned to engage with the adapter body and surround a portion of the blind mate connector.

4. The system of claim 1, wherein the blind mate connector is a male fluid connector configured to engage with a female fluid port of the rack manifold.

5. The system of claim 1, wherein a height separating each mounting rail is a multiple of a standard server height.

6. The system of claim 1, wherein the adapter panel is secured to at least one of the plurality of mounting rails of the server chassis to align with the port of the rack manifold.

7. A modular liquid cooling system with blind mate connectors, comprising: at least one server chassis configured to house a server with at least one cooling module, the at least one server chassis having a plurality of mounting rails mounted on the at least one server chassis, wherein each mounting rail of the plurality of mounting rails are disposed at different heights on the at least one server chassis; at least one fluid connector secured to at least one of the plurality of mounting rails, a fluid connector of the at least one fluid connector including an interior connector configured to fluidly communicate with the at least one cooling module, and a blind mate connector of the blind mate connectors extending from an adapter panel; and a rack manifold of a rack, the rack manifold having at least one port configured to fluidly connect with the blind mate connector extending from the adapter panel.

8. The cooling system of claim 7, wherein the adapter panel is configured to secure to at least one of the plurality of mounting rails of the at least one server chassis.

9. The cooling system of claim 7, wherein the at least one server chassis includes a plurality of server chassis, and each server chassis includes the at least one fluid connector with the adapter panel secured to mounting rails.

10. The cooling system of claim 9, wherein a height separating each mounting rail is a multiple of a standard server height.

11. The cooling system of claim 10, wherein the rack manifold includes a plurality of ports positioned with respect to the multiple of the standard server height in order to align with the blind mate connectors of the plurality of server chassis.

12. The cooling system of claim 7, wherein the at least one server chassis is configured to house a plurality of cooling modules, and the at least one server chassis includes a plurality of fluid connectors mounted thereon.

13. The cooling system of claim 7, further comprising at least one latch mounted on the server chassis and configured to secure to at least one latch of the rack.

14. A method of assembling a modular liquid cooling system with blind mate connectors, comprising: securing at least one fluid connector to at least one mounting rail of a plurality of mounting rails, wherein the plurality of mounting rails are mounted on at least one server chassis, and each mounting rail of the plurality of mounting rails are disposed at different heights on the at least one server chassis, the at least one fluid connector including an interior connector configured to fluidly communicate with at least one cooling module of a server housed in the server chassis, and a blind mate connector extending from an adapter panel; and fluidly connecting the at least one fluid connector to at least one port of a rack manifold of a rack with the blind mate connector extending from the adapter panel.

15. The method of claim 14, wherein securing the at least one fluid connector to the at least one server chassis includes securing the adapter panel to at least one of the plurality of mounting rails of the at least one server chassis.

16. The method of claim 14, further comprising fluidly connecting a plurality of server chassis to a plurality of ports of the rack manifold, wherein each server chassis of the plurality of server chassis includes the at least one fluid connector with the adapter panel secured to the at least one mounting rail.

17. The method of claim 14, further comprising engaging at least one latch mounted on the server chassis to at least one latch of the rack.

18. The method of claim 14, wherein the at least one server chassis is configured to house a plurality of cooling modules, and wherein fluidly connecting the at least one fluid connector to at least one port of the rack manifold includes fluidly connecting a plurality of fluid connectors to a plurality of ports of the rack manifold.

* * * * *